(12) United States Patent
Takagi

(10) Patent No.: US 9,536,843 B2
(45) Date of Patent: Jan. 3, 2017

(54) SEMICONDUCTOR PACKAGE AND SEMICONDUCTOR MODULE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/458,390

(22) Filed: Aug. 13, 2014

(65) Prior Publication Data

US 2015/0179589 A1 Jun. 25, 2015

(30) Foreign Application Priority Data

Dec. 25, 2013 (JP) .................................. 2013-267761
Dec. 25, 2013 (JP) .................................. 2013-267824

(51) Int. Cl.
*H01P 1/02* (2006.01)
*H01L 23/66* (2006.01)
*H01P 5/107* (2006.01)

(52) U.S. Cl.
CPC ............... *H01L 23/66* (2013.01); *H01P 5/107* (2013.01); *H01L 2224/48091* (2013.01); *H01L 2924/0002* (2013.01); *H01L 2924/16153* (2013.01)

(58) Field of Classification Search
CPC .......................... H01L 23/66; H01L 2223/6627
USPC ..................................... 257/664; 333/249, 26
See application file for complete search history.

(56) References Cited

U.S. PATENT DOCUMENTS

| 3,008,104 A | 11/1961 | Scapple et al. |
| 3,103,454 A | 9/1963 | Scapple et al. |
| 5,235,300 A | 8/1993 | Chan et al. |
| 5,381,596 A | 1/1995 | Ferro |

(Continued)

FOREIGN PATENT DOCUMENTS

| JP | 62-86841 | 4/1987 |
| JP | 9-26457 | 1/1997 |

(Continued)

OTHER PUBLICATIONS

Extended European Search Report issued Jul. 15, 2015 in Patent Application No. 14181195.0.

(Continued)

*Primary Examiner* — David Vu
*Assistant Examiner* — Brandon Fox
(74) *Attorney, Agent, or Firm* — Oblon, McClelland, Maier & Neustadt, L.L.P.

(57) ABSTRACT

According to one embodiment, a semiconductor package includes: a first metal body on which a part of a waveguide structure is formed; a second metal body including a mounting area for a semiconductor device and disposed on the first metal body; a line substrate on which a signal transmission line configured to communicate a waveguide with the semiconductor device mounted on the mounting area is formed; and a lid body disposed at a position facing the first metal body, interposing the second metal body and the line substrate. The lid body is made of resin, on which a structure corresponding to another waveguide structure on an extension of the waveguide structure in the first metal body is formed. The structure includes a metal-coated inner wall surface.

6 Claims, 15 Drawing Sheets

(56) References Cited

U.S. PATENT DOCUMENTS

| | | | |
|---|---|---|---|
| 5,528,074 A * | 6/1996 | Goto | H01L 23/66 257/664 |
| 5,801,528 A | 9/1998 | Katoh et al. | |
| 5,808,519 A | 9/1998 | Gotoh et al. | |
| 6,040,739 A | 3/2000 | Wedeen et al. | |
| 6,239,669 B1 | 5/2001 | Koriyama et al. | |
| 6,967,543 B2 * | 11/2005 | Ammar | H01P 5/103 333/125 |
| 7,106,153 B2 * | 9/2006 | Chang | H01P 1/042 333/249 |
| 7,388,450 B2 | 6/2008 | Camiade et al. | |
| 8,072,065 B2 | 12/2011 | Lopez et al. | |
| 8,901,719 B2 * | 12/2014 | Ligander | H01L 23/49503 257/664 |
| 2003/0107459 A1 | 6/2003 | Takahashi et al. | |
| 2004/0080377 A1 | 4/2004 | Chang et al. | |
| 2004/0227597 A1 | 11/2004 | Chang et al. | |
| 2006/0097818 A1 | 5/2006 | Camiade et al. | |
| 2006/0097819 A1 * | 5/2006 | Lo Hine Tong | H01P 5/107 333/26 |
| 2009/0206473 A1 | 8/2009 | Lopez et al. | |
| 2010/0038775 A1 | 2/2010 | Camiade et al. | |
| 2010/0315799 A1 | 12/2010 | Suzuki | |
| 2012/0139099 A1 * | 6/2012 | Lopez | H01L 23/13 257/728 |
| 2012/0248587 A1 * | 10/2012 | Alleaume | H01L 23/047 257/664 |
| 2013/0156972 A1 | 6/2013 | Yanagimoto et al. | |

FOREIGN PATENT DOCUMENTS

| | | |
|---|---|---|
| JP | 10-65038 | 3/1998 |
| JP | 10-173403 A | 6/1998 |
| JP | 10-303613 | 11/1998 |
| JP | 2000-151222 | 5/2000 |
| JP | 2000-244211 | 9/2000 |
| JP | 2001-267814 | 9/2001 |
| JP | 2001-284476 | 10/2001 |
| JP | 3464118 B2 | 11/2003 |
| JP | 3485520 B2 | 1/2004 |
| JP | 2006-507740 | 3/2006 |
| JP | 2006-237967 | 9/2006 |
| JP | 4575247 B2 | 11/2010 |
| JP | 2011-120155 | 6/2011 |
| JP | 2012/69647 | 4/2012 |
| KR | 10-2005-0055204 A | 6/2005 |
| KR | 10-2006-0045853 A | 5/2006 |
| KR | 10-1200813 B1 | 11/2012 |
| TW | 200406081 A | 4/2004 |
| TW | 200943616 A1 | 10/2009 |

OTHER PUBLICATIONS

U.S. Appl. No. 14/334,888, filed Jul. 18, 2014, Kazutaka Takagi.
U.S. Appl. No. 14/334,791, filed Jul. 18, 2014, Kazutaka Takagi.
U.S. Appl. No. 14/334,867, filed Jul. 18, 2014, Kazutaka Takagi.
Office Action issued Sep. 4, 2015 in Korean Patent Application No. 10-2014-0116103 (with English language translation).
Office Action issued Sep. 4, 2015 in Korean Patent Application No. 10-2014-0116102 (with English language translation).
Office Action issued Sep. 4, 2015 in Korean Patent Application No. 10-2014-0116105 (with English language translation).
Office Action issued Oct. 22, 2015 in Taiwanese Patent Application No. 103127753.
Extended European Search Report issued Jul. 27, 2015 in Patent Application No. 14177700.3.
Extended European Search Report issued Jul. 27, 2015 in Patent Application No. 14177873.8.
Extended European Search Report issued Jul. 27, 2015 in Patent Application No. 14177701.1.
Office Action issued on Jul. 25, 2016 in Korean Patent Application No. 10-2014-0101439.

* cited by examiner

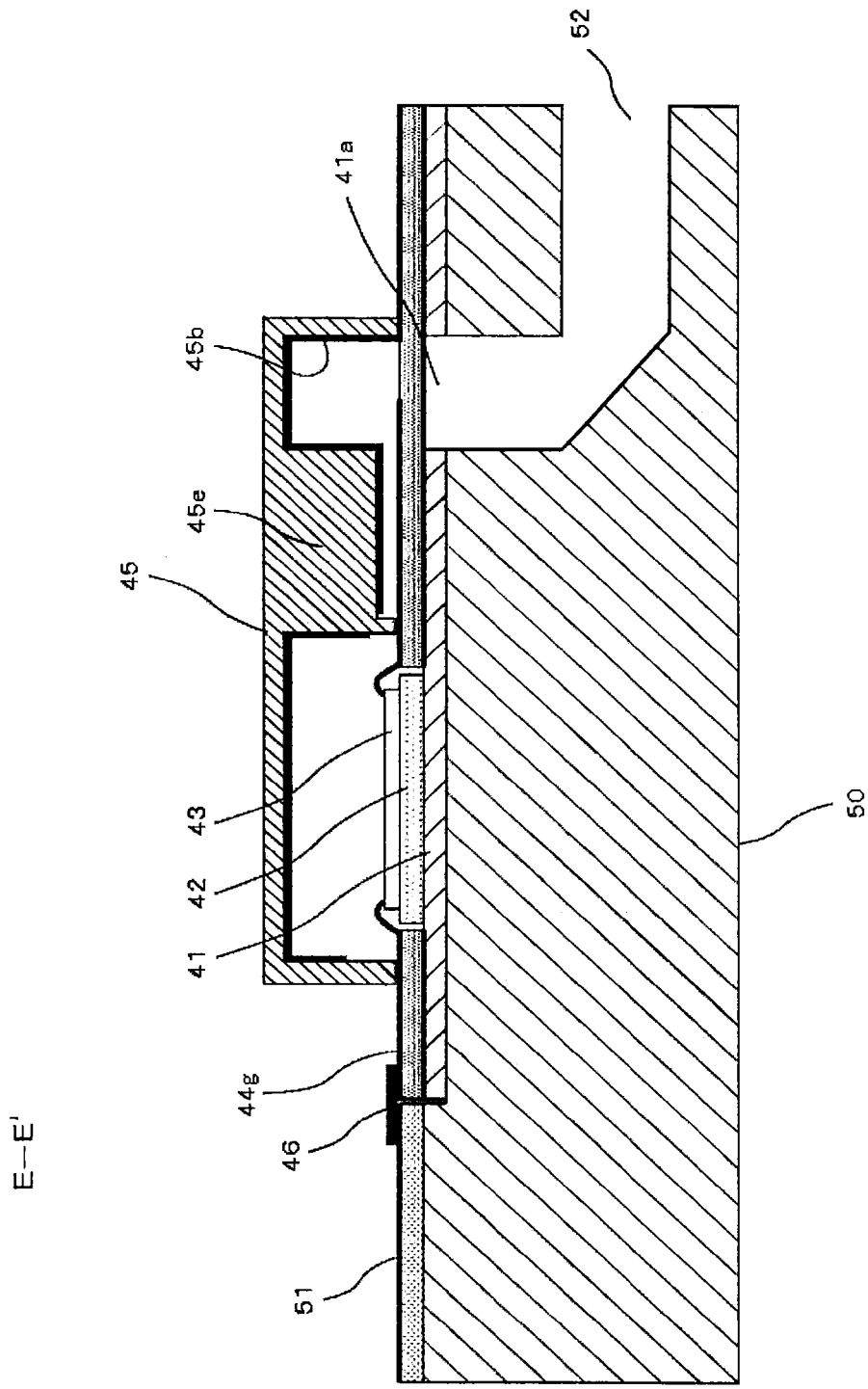

SEMICONDUCTOR PACKAGE AND SEMICONDUCTOR MODULE

CROSS-REFERENCE TO RELATED APPLICATIONS

This application is based upon and claims the benefit of priority from the prior Japanese Patent Applications Nos. 2013-267761, filed on Dec. 25, 2013 and 2013-267824, filed on Dec. 25, 2013, the entire contents of which are incorporated herein by reference.

FIELD

Embodiments described herein relate generally to a semiconductor package, a semiconductor module, and a semiconductor device.

BACKGROUND

In the case of transmitting a signal of a millimeter waveband, a waveguide is sometimes used. A signal transmitted by the waveguide passes a signal transmission line such as a microstrip line and is inputted into a semiconductor. Generally, a quarter wavelength antenna line and a back-short structure are adopted at a connecting portion between the waveguide and the signal transmission line.

When a semiconductor package including the back-short structure is mounted with a semiconductor device having a large amount of heat generation, such as a semiconductor chip for signal power amplification, the semiconductor package is required to have high heat radiation characteristics. However, according to a semiconductor package in a related art which is lightweight and low cost, sufficient heat radiation characteristics cannot be obtained because the package has pseudo-waveguide in a dielectric substrate and the semiconductor device is mounted on the dielectric substrate.

Further, to reduce weight of a final product, the semiconductor package is desired to be lightweight. However, according to the semiconductor package in the related art, the back-short structure is heavyweight because of being made of metal.

BRIEF DESCRIPTION OF THE DRAWINGS

FIG. 12 is a cross-sectional view taken along a plane E-E' indicated in FIG. 11.

DETAILED DESCRIPTION

Figure 1:
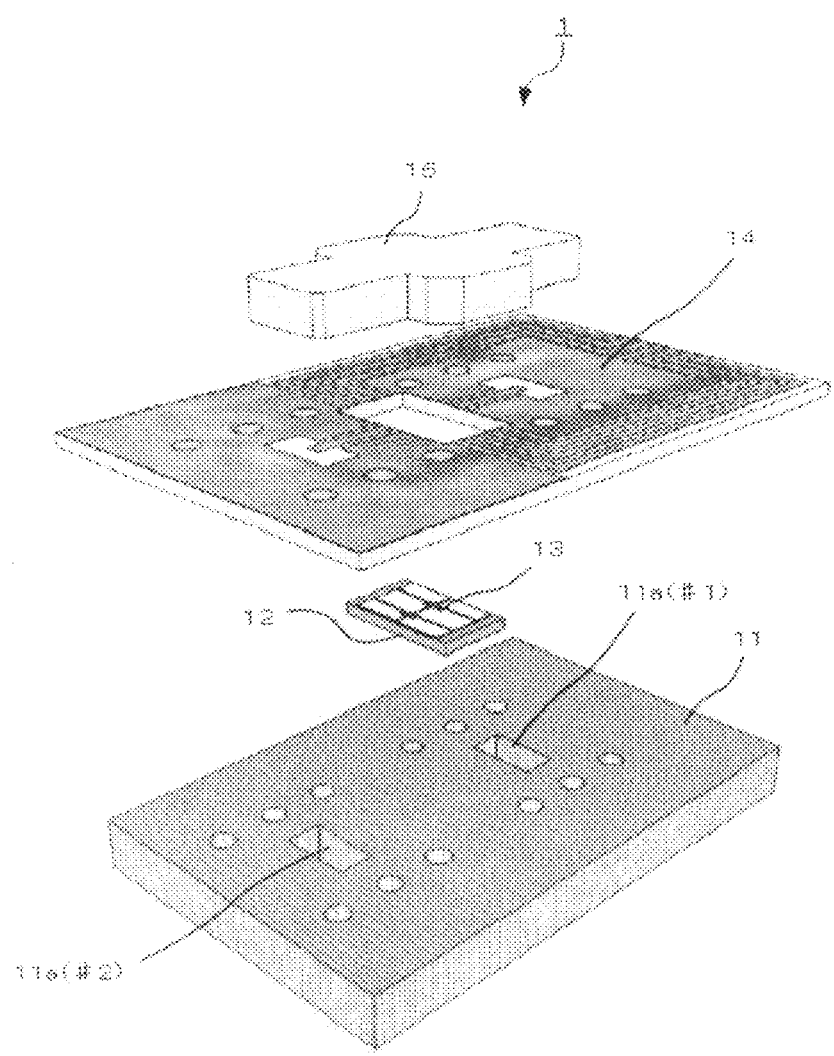
FIG. 1 is an exploded perspective view illustrating a semiconductor package according to a first embodiment.

A semiconductor package according to an embodiment includes a first metal body on which a waveguide structure is formed, and a second metal body including a mounting area for a semiconductor device and disposed on the first metal body, a line substrate on which a transmission line configured to communicate a waveguide with the semiconductor device mounted on the mounting area is formed, and a lid body disposed at a position facing the first metal body, interposing the second metal body and the line substrate. The lid body is made of resin, on which a structure corresponding to another waveguide structure on an extension of the waveguide structure in the first metal body is formed. The structure includes a metal-coated inner wall surface.

The present embodiment will be described below with reference to the drawings. In the drawing, portions identical or equivalent are denoted by the same reference signs.

(First Embodiment)

FIGS. 1 to 3D are views illustrating a semiconductor package according to a first embodiment. In all of the drawings, a semiconductor device 13 is housed inside the semiconductor package. The semiconductor device 13 is formed of a semiconductor chip. For example, the semiconductor device 13 is formed of a semiconductor chip for signal power amplification including a plurality of active devices (e.g., semiconductor device for signal amplification). Note that, in the following description, not only a semiconductor package not mounted with a semiconductor device but also a semiconductor package mounted with a semiconductor device will be referred to as "semiconductor package". The semiconductor package mounted with the semiconductor device can also be referred to as "semiconductor module".

As illustrated in FIGS. 1 to 3D, a semiconductor package 1 includes a waveguide interface metal plate 11 as a first metal body, a chip-mounting metal plate 12 as a second metal body, a semiconductor device 13, a line substrate 14, and a lid body 15.

Figure 2A:
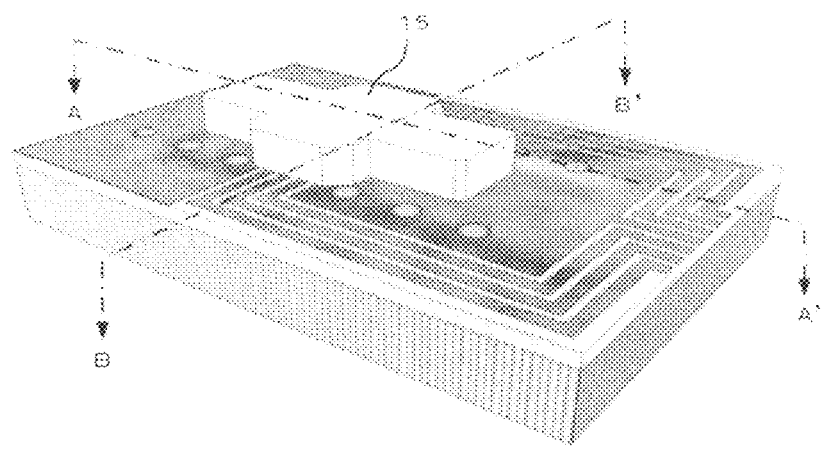
FIG. 2A is an external perspective view illustrating the semiconductor package exemplified in FIG. 1.
Figure 2B:
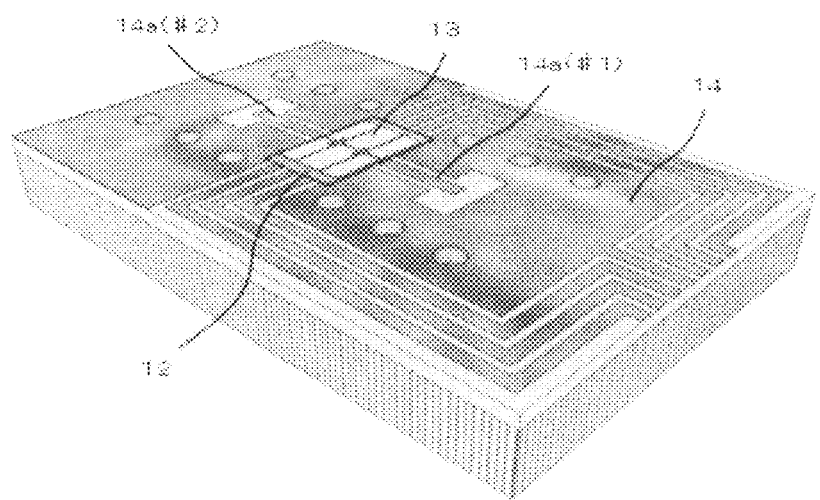
FIG. 2B is a perspective view illustrating the semiconductor package from which a lid body is removed.
Figure 2C:
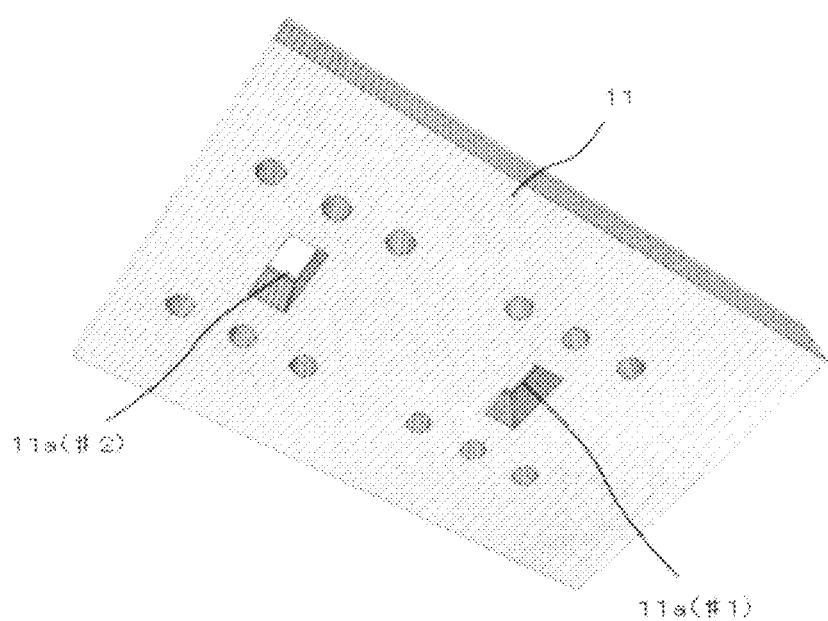
FIG. 2C is a perspective view from a lower side illustrating the semiconductor package exemplified in FIG. 1.

The waveguide interface metal plate 11 is a flat metal plate. The waveguide interface metal plate 11 is formed of, for example, copper, aluminum, or alloy containing these metals. On the waveguide interface metal plate 11, two through-holes 11a (through-hole 11a (#1) and through-hole 11a (#2)) are formed separately as illustrated in FIG. 2C. The through-hole 11a has a shape corresponding to a cross-sectional shape of the waveguide connected to the semiconductor package 1. An opening at a lower side of the through-hole 11a is a portion to become a connection end between the semiconductor package 1 and the outside. In the opening at the lower side of the through-hole 11a, for example, a waveguide for a millimeter waveband (not illustrated) is connected in order to input and output a signal. In the case where the waveguide is connected, the through-hole 11a becomes a part of a conduit line of the waveguide.

Figure 3A:
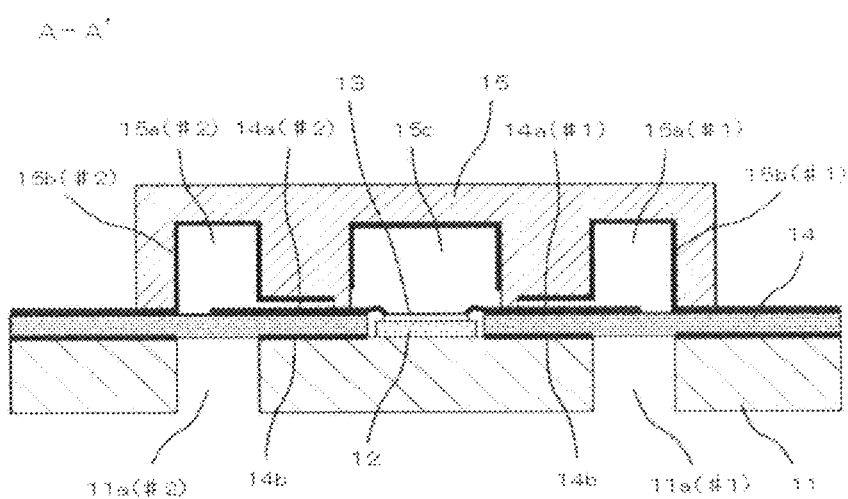
FIG. 3A is a cross-sectional view taken along a plane A-A' indicated in FIG. 2A.

As illustrated in FIG. 3A, the chip-mounting metal plate 12 is disposed on an upper surface of the waveguide interface metal plate 11 and between the two through-holes 11a. The chip-mounting metal plate 12 is a flat metal plate. The chip-mounting metal plate 12 is fixed to the waveguide interface metal plate 11, and has a lower surface adhered to the upper surface of the waveguide interface metal plate 11. The chip-mounting metal plate 12 includes a mounting area for mounting the semiconductor device and the like on an upper surface thereof. According to the present embodiment, the semiconductor device is mounted on this mounting area. The chip-mounting metal plate 12 is formed of, for example, a metal having good thermal conductivity, such as copper. Therefore, the chip-mounting metal plate 12 is a good heat radiation path that conducts heat of the semiconductor device 13 to the waveguide interface metal plate 11.

The line substrate 14 is disposed on the upper surface of the waveguide interface metal plate 11. The line substrate 14 is fixed to an adjacent area of the chip-mounting metal plate 12 so as to cover the two through-holes 11a. The line substrate 14 is a flat dielectric substrate. A signal-side conductor 14a is formed on an upper surface of the line substrate 14 and a ground-side conductor 14b is formed on a lower surface thereof.

A transmission line for signal output and input for the semiconductor device 13 is formed on the line substrate 14. This signal transmission line includes a signal-side conductor 14a and a ground-side conductor 14b. The signal transmission line connects the semiconductor device 13 to the respective two through-holes 11a which are the connected ends for input and output signals of the semiconductor package 1. The signal-side conductor 14a includes an extending portion 14d. The extending portion 14d is a portion overlapping an open surface of the through-hole 11a. A length of the extending portion 14d is a quarter of a signal wavelength in a transmission line. The extending portion 14d will be described later.

Note that the ground-side conductor 14b may be entirely formed planar. Further, the ground-side conductor 14b may be fixed to the waveguide interface metal plate 11 such that an entire surface thereof contacts the waveguide interface metal plate 11.

The lid body 15 is a box type lid body having side wall surfaces with a constant height. The lid body 15 is disposed on the line substrate 14 so as to integrally cover the through-holes 11a and the chip-mounting metal plate 12 from above.

On a lower surface side of the lid body 15, recessed portions (space 15a (#1) and space 15a (#2) illustrated in FIG. 3A) to be back-short ends are formed. The back-short end is an end portion of the waveguide provided with the short-circuit surface (back-short), and forms a part of the back-short structure. In many cases, the back-short structure includes the back-short at the end portion of the waveguide. Further, an end of the signal transmission line such as a microstrip line is inserted in the vicinity of the end portion. Generally, a distance between the signal transmission line and the back-short is a quarter of a transmission signal wavelength in the waveguide, and an insertion length in the signal transmission line is a quarter of a transmission signal wavelength in the signal transmission line.

The space 15a is located at a position corresponding to the open surfaces of the through-hole 11a. The space 15a is a space partitioned by an outer wall of the lid body 15 and an inner partition wall of the lid body 15. The space 15a has a shape formed by extending the shape of the open surface of the through-hole 11a upward as it is. The height from the signal-side conductor 14a to an upper wall surface 15d (indicated by H in FIG. 3B) is a quarter of a signal wavelength in the waveguide. An entire inner wall surface 15b of the space 15a is metal-coated. By this metal coating, the space 15a functions as the back-short end of the waveguide.

On the lower surface side of the lid body 15, a space 15c is formed in addition to the space 15a (#1) and the space 15a (#2) as illustrated in FIG. 3A. The space 15c is a space for housing a part of the semiconductor device 13 and line substrate 14.

The lid body 15 is formed of a light resin material such as plastic. Accordingly, the lid body is, of course, lightweight and an entire semiconductor package 1 is lightweight.

The through-hole 11a, space 15a, and a part of the line substrate 14 (the portion interposed between the through-hole 11a and space 15a) are to be a signal converting section. In the converting section, a signal transmitted at the waveguide is converted to a signal converted at the line substrate 14, and the signal converted at the line substrate 14 is converted to the signal transmitted at the waveguide. The semiconductor package 1 according to the present embodiment includes two converting sections. The two converting sections have the same structure.

Figure 3B:
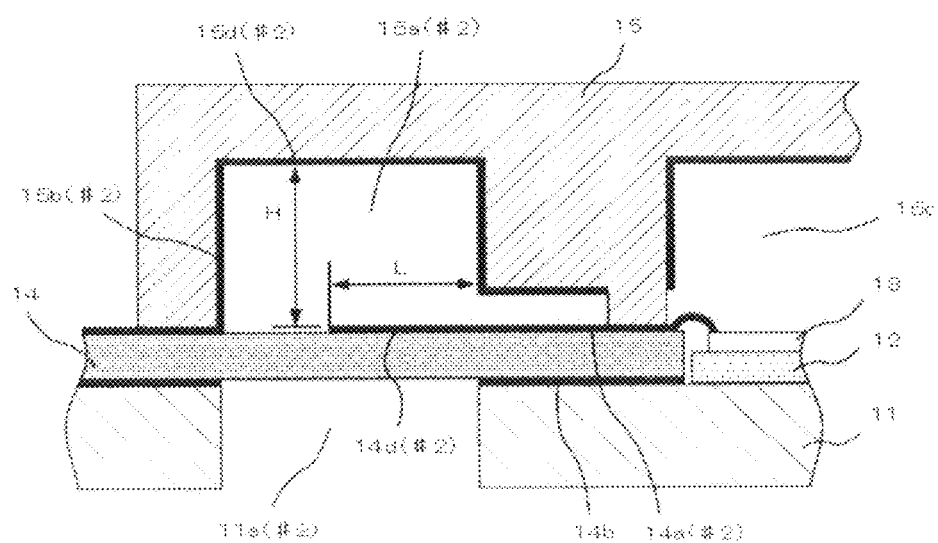
FIG. 3B is an enlarged view illustrating a connecting portion between a through-hole and a line substrate.
Figure 3C:
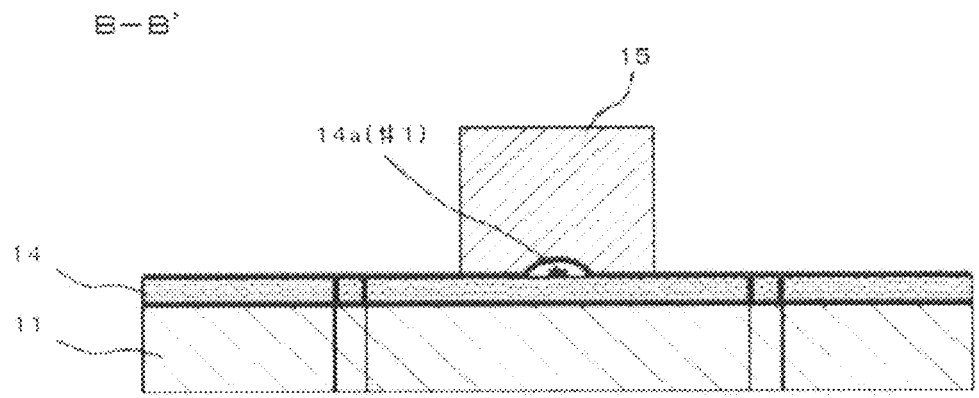
FIG. 3C is a cross-sectional view taken along a plane B-B' indicated in FIG. 2A.
Figure 3D:
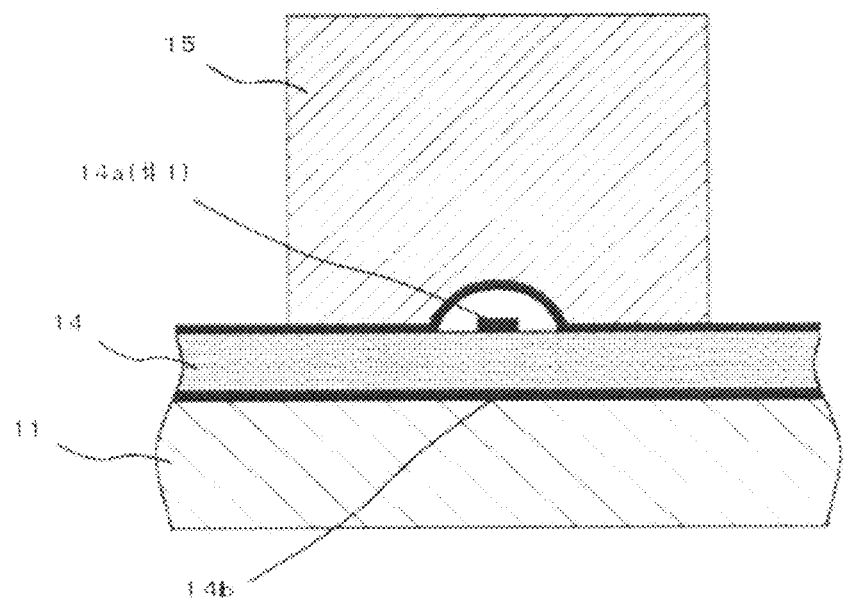
FIG. 3D is an enlarged view illustrating a connecting portion between the lid body and the line substrate.

FIG. 3B is an enlarged view illustrating one of the converting sections illustrated in FIG. 3A. More specifically, FIG. 3B is the enlarged view illustrating the converting section on the through-hole 11a (#2) side (left side of FIG. 3A). In the example of FIG. 3B, the waveguide (not illustrated) is connected from a lower side of the opening of the through-hole 11a. The line substrate (#2) extends above the through-hole (#2) so as to plug the open surface. At this extended portion, the extending portion 14d is formed. The extending portion 14d is an end portion of the signal-side conductor 14a. More specifically, the extending portion 14d is an extended portion of the signal-side conductor 14a so as to overlap the open surface of the through-hole 11a. The extending portion 14d has a length L which is a quarter of the signal wavelength in the signal transmission line. Above the extending portion 14d, the space 15a (#2) is formed. The height H from the extending portion 14d to the upper wall surface 15d (#2) of the space 15a (#2) is a quarter of the signal wavelength in the waveguide.

The inner wall surface 15b of the space 15a is entirely metal-coated. For the metal coating material, gold, silver, or the like is used, for example. The inner wall surface of the space 15a becomes a flat surface having little roughness on the surface by applying such metal coating to the inner wall surface 15b. This configuration reduces loss of signal at the converting section. The above-described structure at the converting section is sometimes called the back-short structure. Also, the upper wall surface 15d of the space 15a is sometimes called a short-circuit surface, or a back-short.

The semiconductor package 1 according to the present embodiment includes an interface to be connected to the waveguide. Therefore, in many cases, the semiconductor package 1 houses a semiconductor device having a relatively large amount of heat generation, such as a semiconductor device including a semiconductor active device for signal power amplification and the like. In the case of the present embodiment, the semiconductor device is mounted on the chip-mounting metal plate 12. The chip-mounting metal plate 12 functions as a good heat radiation path to the wave guide interface metal plate 11 because the chip-mounting metal plate 12 is formed of the metal having good thermal conductivity. Therefore, even in the case where the semiconductor device has a large amount of heat generation, the semiconductor device can have sufficient heat radiation characteristics.

Further, the lid body 15 entirely covers the through-holes 11a, chip-mounting metal plate 12, semiconductor device 13, and the line substrate 14 from above, and also includes the spaces 15a (#1) and 15a (#2) formed on the lower surface side thereof. In the case of manufacturing the lid body 15 having the above-described shape and configuration by a mold, using metallic material, for example, the lid body 15 becomes heavyweight. Further, loss of the signal at the converting section between the waveguide and the line substrate 14 becomes large because it is difficult to reduce roughness on the inner wall surface 15b. Since the resin such as plastic is used for the material of the lid body 15 according to the present embodiment, the lid body 15 is lightweight and easily manufactured by the mold. Moreover, since the inner wall surface 15b of the space 15a is metal-coated, the inner wall surface 15b is a smooth flat surface having little roughness on the surface. As a result, loss of the signal at the converting section is small.

As described above, according to the present embodiment, it is possible to obtain the semiconductor package having sufficient heat radiation characteristics and including the waveguide interface having small signal transmission loss, small-sized, lightweight, and easily manufactured.

(Second Embodiment)

Figure 4:
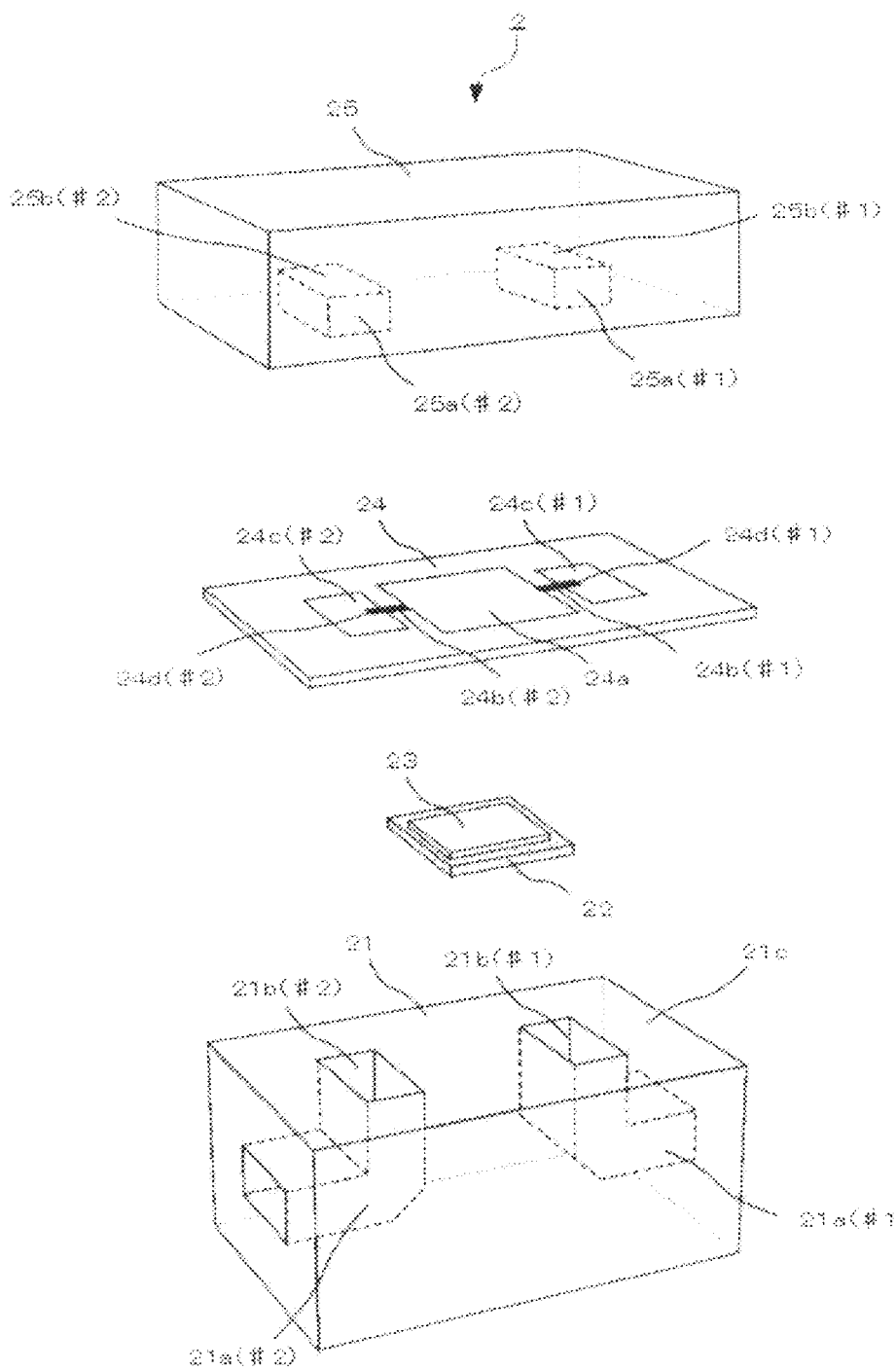
FIG. 4 is an exploded perspective view illustrating a semiconductor package according to a second embodiment.

FIG. 4 is an exploded perspective view illustrating a semiconductor package according to a second embodiment. A main section is illustrated in a transparent manner. A semiconductor device 23 is housed inside the semiconductor package. As illustrated in FIG. 4, a semiconductor package 2 includes a metal block 21 as a first metal body, a chip-mounting metal plate 22 as a second metal body, the semiconductor device 23, aline substrate 24, and a lid body 25 as a lid body.

The metal block 21 is a waveguide incorporated metal block inside which the waveguide path is formed. The waveguide path is a through-hole and forms a part of a back-short structure. The metal block 21 is formed of, for example, copper, aluminum, or alloy containing these metals. An external shape of the metal block 21 is a cuboid. The metal block 21 has respective surfaces formed flat. Inside the metal block 21, two independent waveguide paths 21a (21a (#1) and 21a (#2)) are formed separately. In the case of the present embodiment, the waveguide path 21a functions as a waveguide interface. An end of the waveguide path (opening 21b (#1) and 21b (#2)) is exposed on one of the surfaces of the metal block 21. Note that the flat surface on which the openings 21b (#1) and 21b (#2) are exposed are the same flat surface (hereinafter referred to as an exposed flat surface 21c).

The flat-shaped chip-mounting metal plate 22 is disposed on the exposed flat surface 21c. More specifically, the chip-mounting metal plate 22 is disposed between the openings 21b (#1) and 21b (#2). The chip-mounting metal plate 22 is fixed to the metal block 21 with a lower surface thereof bonded to the exposed flat surface 21c. The chip-mounting metal plate 22 includes a mounting area (not illustrated) for the semiconductor device and the like on an upper surface thereof. In the example of FIG. 4, the semiconductor device 23 is mounted on the mounting area. The chip-mounting metal plate 22 is formed of, for example, a metal having good thermal conductivity, such as copper. Accordingly, the chip-mounting metal plate 22 is a good heat radiation path that conducts heat of the semiconductor device 23 to the metal block 21.

On the exposed flat surface 21c, the line substrate 24 is disposed so as to block two openings 21b. The line substrate 24 includes an opening 24a formed so as to surround the chip-mounting metal plate 22. Also, two transmission lines 24b are formed on the line substrate 24. A transmission line 24b (#1) is a signal transmission path that communicates the waveguide path 21a (#1) with the semiconductor device 23, and a transmission line 24b (#2) is a signal transmission path that communicates the waveguide path 21a (#2) with the semiconductor device 23. Each of these transmission lines 24b is formed of a signal-side conductor and a ground-side conductor. The signal-side conductor is formed on an upper surface side of the line substrate 24, and the ground-side conductor is formed on a lower surface side of the line substrate 24. The line substrate 24 includes a dielectric substrate. The dielectric substrate is positioned between the signal-side conductor and the ground-side conductor. Note that the ground-side conductor is bonded to the exposed flat surface 21c according to the present embodiment.

The signal-side conductor of the transmission line 24b includes extending portions 24d (extending portion 24d (#1) and 24d (#2)) at end portions thereof. The extending portion 24d extend above portions 24c (portion 24c (#1) and 24c (#2)). The portions 24c are positioned on the upper surface of the openings 21b of the two waveguide paths. The extending portion 24d has a length which is a quarter of a signal wavelength in the signal transmission line. The extending portion 24d forms a part of the back-short structure. The ground-side conductor is removed in accordance with a shape of the opening 21b.

Further, the lid body 25 made of resin is disposed on the line substrate 24 so as to entirely cover the line substrate 24. The lid body 25 is a back-short incorporated lid body formed with a back-short end. The lid body 25 is bonded to the line substrate 24. According to the present embodiment, an external shape of the lid body 25 is a cuboid.

On a lower surface side of the lid body 25, recessed portions (space 25a (#1) and space 25a (#2) to be back-short ends illustrated in FIG. 4) are formed. The recessed portion has a structure corresponding to the waveguide path formed at the metal block 21. The space 25a is placed at a position corresponding to the opening 21b of the waveguide path, namely, the position corresponding to the portion 24c on the line substrate. The space 25a has a shape formed by extending the shape of the opening 21b upward as it is. A height from the extending portion 24d to an upper wall surface 25b is a quarter of a signal wavelength in the waveguide. An entire inner wall surface of the space 25a is metal-coated. By this metal coating, the upper wall surface 25b of the space 25a functions as the back-short of the waveguide.

For the metal coating material, gold, silver, or the like is used. The inner wall surface of the space 25a becomes a flat surface having little roughness on the surface by applying such metal coating. This configuration reduces loss of signal at the back-short structure. Further, since light resin such as plastic is used as the material of the lid body 25, the lid body 25 is lightweight. The lid body 25 has a comparatively large volume, and therefore the weight of the entire semiconductor package 2 is considerably reduced.

The semiconductor device is mounted on the chip-mounting metal plate 22 according to the present embodiment as well. The chip-mounting metal plate 22 functions as a good heat radiation path to the metal block 21 because the chip-mounting metal plate 22 is formed of the metal having good thermal conductivity. Therefore, even in the case where the semiconductor device has a large amount of heat generation, the semiconductor device can have sufficient heat radiation characteristics. Also, since the resin such as plastic is used for the material of the lid body 25, the lid body 25 is lightweight and easily manufactured by a mold. Moreover, since the inner wall surface of the space 25a is metal-coated, the inner wall surface of the space 25a is a smooth flat surface having little roughness on the surface. As a result, loss of the signal at the converting section is small.

Therefore, according to the present embodiment also, it is possible to obtain the semiconductor package having sufficient heat radiation characteristics and including the waveguide interface having small signal transmission loss, small-sized, lightweight, and easily manufactured.

(Third Embodiment)

Figure 5:
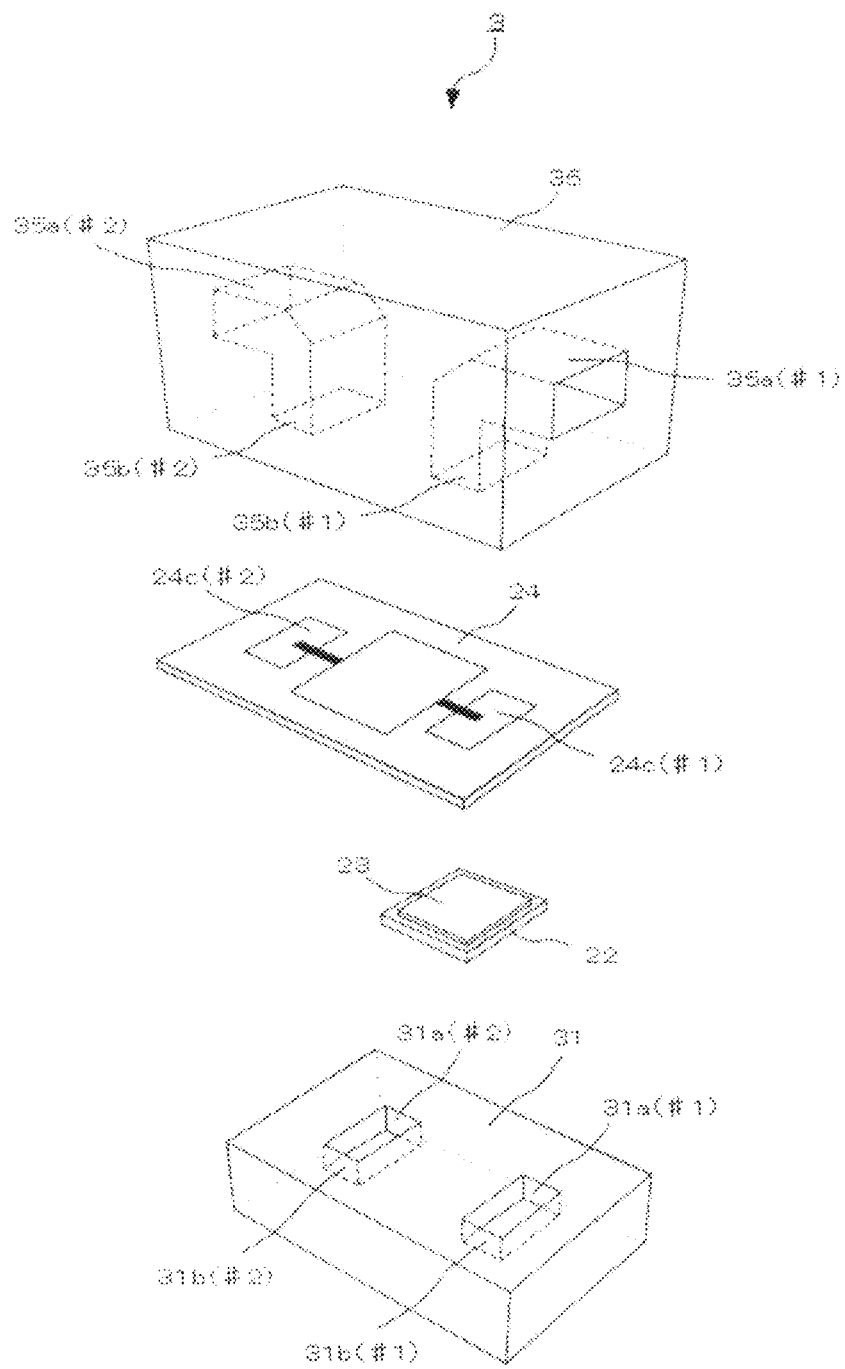
FIG. 5 is an exploded perspective view illustrating a semiconductor package according to a third embodiment.

FIG. 5 is an exploded perspective view illustrating a semiconductor package according to a third embodiment. The portions identical to those in a semiconductor package according to a second embodiment are denoted by same reference signs. According to the second embodiment, a lowest layer of the semiconductor package is a metal block formed with a waveguide inside thereof, and a highest layer is a resin-made lid body formed with the back-short end. However, according to the third embodiment, the lowest layer of the semiconductor package is a metal block formed with a back-short end, and the highest layer is a resin-made lid body formed with the waveguide path inside thereof. In the following, a semiconductor package 3 according to the third embodiment will be described. Note that description that overlaps the second embodiment will be simplified.

In FIG. 5 also, a main section is illustrated in a transparent manner. A semiconductor device 23 is housed inside the semiconductor package. As illustrated in FIG. 5, the semiconductor package 3 includes a metal block 31 as a first metal body, a chip-mounting metal plate 22 as a second metal body, the semiconductor device 23, a line substrate 24, and a lid body 35.

The metal block 31 is a back-short incorporated metal block in which the back-short end is formed. The metal block 31 is formed of, for example, copper, aluminum, or alloy containing these metals. According to the present embodiment, an external shape of the metal block 31 is a cuboid. The metal block 31 has respective surfaces formed flat. Two recessed portions 31a (31a (#1) and 31a (#2)) are separately formed on one of the surfaces of the metal block 31, and recessed in a shape corresponding to a shape of an opening of the waveguide path. Further, a depth of the recessed portion 31a up to a bottom surface 31b corresponds to a quarter of a signal wavelength in the waveguide. An inner wall surface of the recessed portion 31a including the bottom surface 31b is coated with a metallic material such as gold or silver. Accordingly, the recessed portion 31a functions as the back-short end of the waveguide. In this case, the bottom surface 31b of the recessed portion 31a is to be the back-short. As described above, the back-short end forms a part of the back-short structure.

The chip-mounting metal plate 22 is disposed on the flat surface where the recessed portions 31a are formed. More specifically, the chip-mounting metal plate 22 is formed between the two recessed portions 31a. The chip-mounting metal plate 22 includes a mounting area (not illustrated) for the semiconductor device and the like on an upper surface thereof. In the example of FIG. 5, the semiconductor device 23 is mounted on the mounting area. The chip-mounting metal plate 22 is formed of, for example, a metal having good thermal conductivity, such as copper. Accordingly, the chip-mounting metal plate 22 is a good heat radiation path that conducts heat of the semiconductor device 23 to the metal block 31.

Further, the line substrate 24 is disposed on the flat surface where the recessed portions 31a are formed. A structure of the line substrate 24 is same as the structure of the line substrate 24 described in the second embodiment. However, portions 24c of the line substrate 24 are positioned at places corresponding to the two recessed portions 31a of the metal block 31. The portions 24c and the recessed portion 31a integrally form the back-short structure that converts a signal connection between signal transmission line and the waveguide.

Further, the resin-made lid body 35 is disposed on the line substrate 24 so as to entirely cover the line substrate 24. The lid body 35 is a waveguide path incorporated lid body inside which the waveguide path is formed inside thereof. The waveguide path is a through-hole and forms a part of the back-short structure. The lid body 35 is bonded to the line substrate 24. According to the present embodiment, an external shape of the lid body 35 is a cuboid. The lid body 35 includes two waveguide paths 35a (35a (#1) and 35a (#2)) formed inside thereof. The waveguide path 35a has a structure corresponding to the back-short end formed at the metal block 31. In the case of the present embodiment, the waveguide path 35a functions as a waveguide interface. Openings of the waveguide path 35a (35b (#1) and 35b (#2)) on one side are positioned at places corresponding to the portions inside the line substrate 24 (24c (#1) and 24c (#2)). The lid body 35 is made of light resin such as plastic for weight reduction. Therefore, an inner wall surface of the waveguide path 35a is entirely coated with a metal material such as gold and silver. By this metal coating, the inner wall surface has a smooth flat surface having little roughness on the surface. Accordingly, the waveguide path 35a can function as the waveguide.

The semiconductor device is mounted on the chip-mounting metal plate 22 according to the present embodiment as well. The chip-mounting metal plate 22 functions as a good heat radiation path to the lid body 35 because the chip-mounting metal plate 22 is formed of the metal having good thermal conductivity. Therefore, even in the case where the semiconductor device has a large amount of heat generation, the semiconductor device can have sufficient heat radiation characteristics. Also, since the resin such as plastic is used for the material of the lid body 35, the lid body 35 is lightweight and easily manufactured by a mold. Moreover, since the inner wail surface of the recessed portion 31a and the inner wall surface of the waveguide path 35a are metal-coated, the inner wall surfaces are smooth flat surfaces having little roughness on the surface. As a result, loss of the signal at the converting section is small. Therefore, according to the present embodiment also, it is possible to obtain the semiconductor package having sufficient heat radiation characteristics and including the waveguide interface having small signal transmission loss, small-sized, lightweight, and easily manufactured.

(Fourth Embodiment)

In many cases, a semiconductor device for signal power amplification is housed in a semiconductor package adopting a waveguide interface. The semiconductor package is desirable to include the waveguide interface on a signal output side (latter stage side) of the semiconductor package because a waveguide is capable of handling a signal having larger power. On the other hand, in many cases, the semiconductor package includes, on a former stage side, a device that is provided with many signal transmission lines such as microstrip lines and handles a signal having a small signal level. Considering loss of a signal at the time of signal conversion, the semiconductor package is desired to include, on the former stage side, a signal input interface to which a signal transmission line such as the microstrip line can be directly connected.

Now, according to a fourth embodiment, description will be given for a semiconductor package including a waveguide interface on a later stage side (signal output side) and also including, on a former stage side, a signal input interface to which a signal transmission line such as the microstrip line can be connected.

Figure 6:
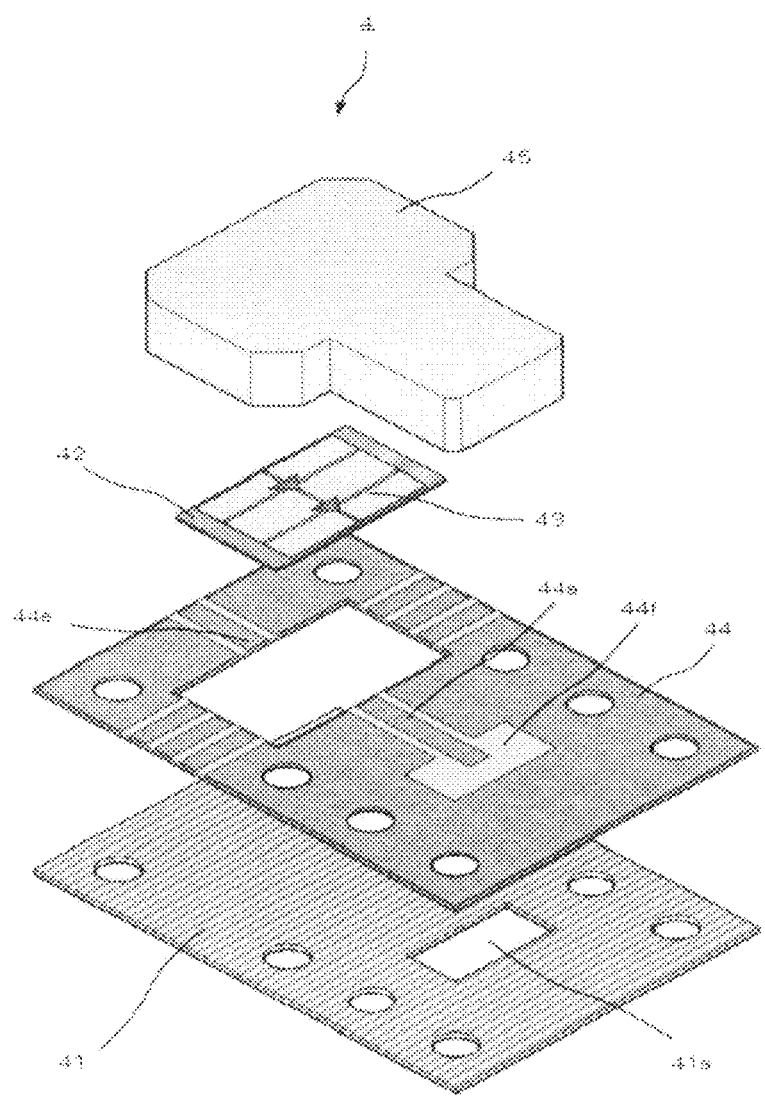
FIG. 6 is an exploded perspective view illustrating an exemplary semiconductor package according to a fourth embodiment.
Figure 7A:
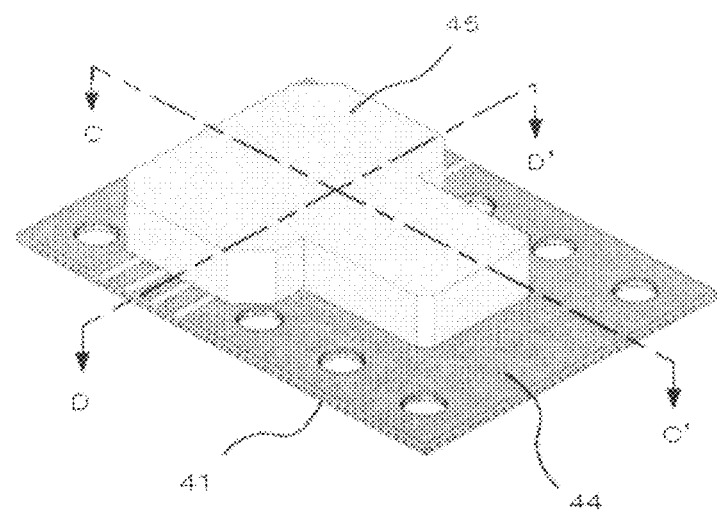
FIG. 7A is an external perspective view illustrating the semiconductor package exemplified in FIG. 6.
Figure 7B:
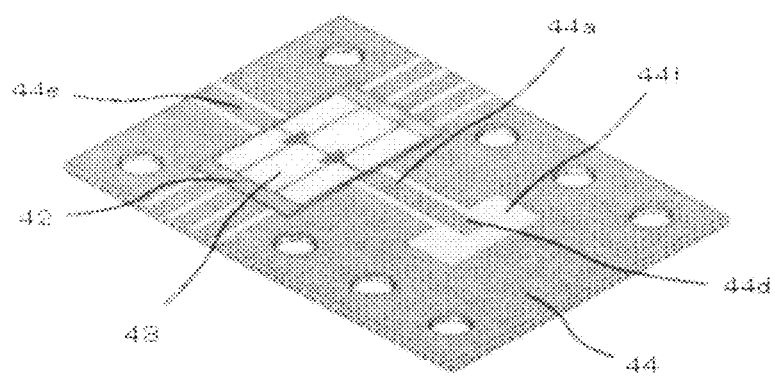
FIG. 7B is a perspective view illustrating the semiconductor package from which a lid body is removed.
Figure 7C:
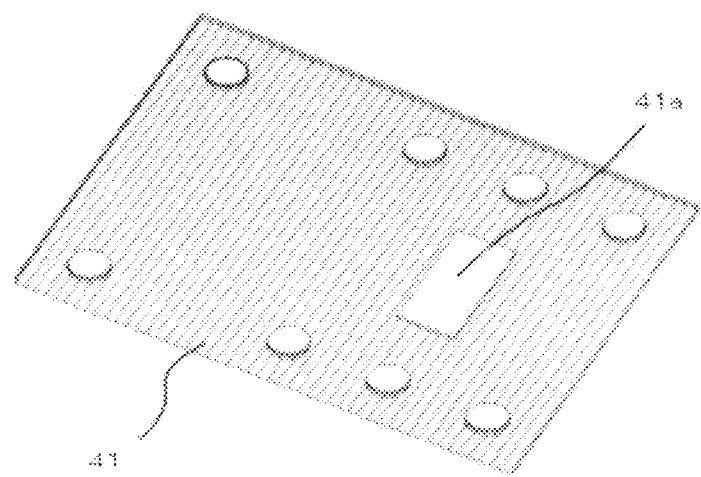
FIG. 7C is a perspective view from a lower side illustrating the semiconductor package exemplified in FIG. 6.
Figure 7D:
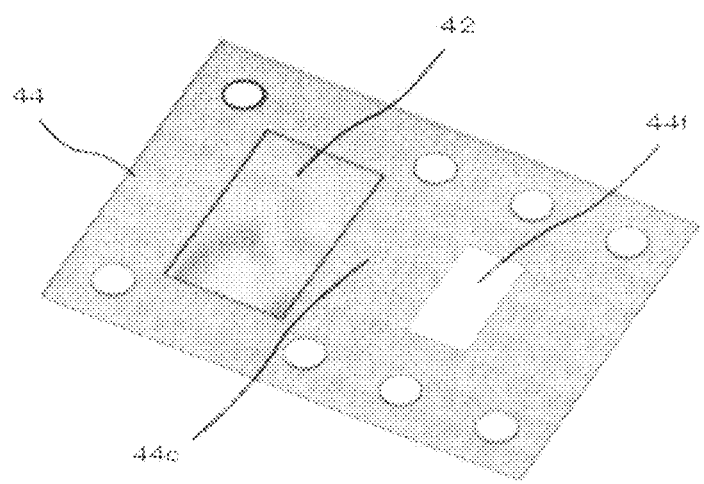
FIG. 7D is a perspective view from a lower side illustrating a line substrate included in the semiconductor package.
Figure 8:
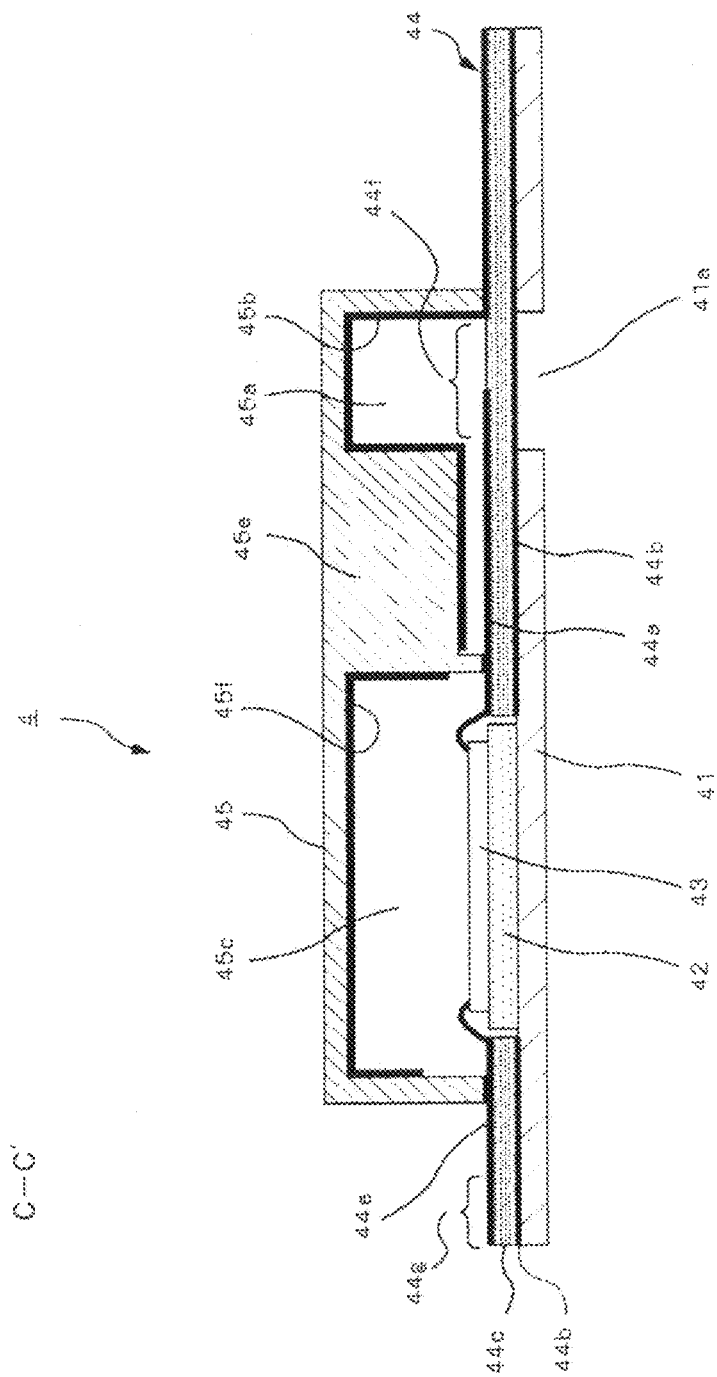
FIG. 8 is a cross-sectional view taken along a plane C-C' indicated in FIG. 7A.
Figure 9:
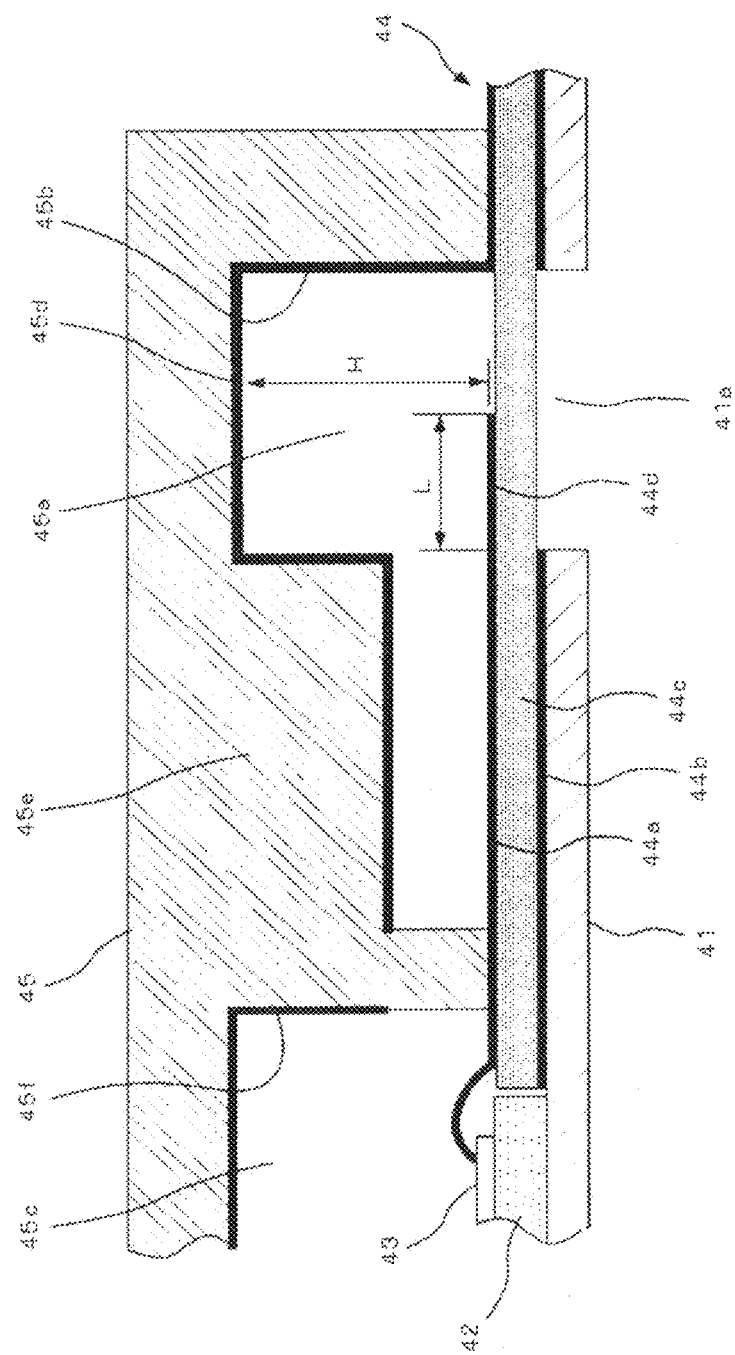
FIG. 9 is an enlarged cross-sectional view Illustrating a converting section illustrated in FIG. 8.
Figure 10A:
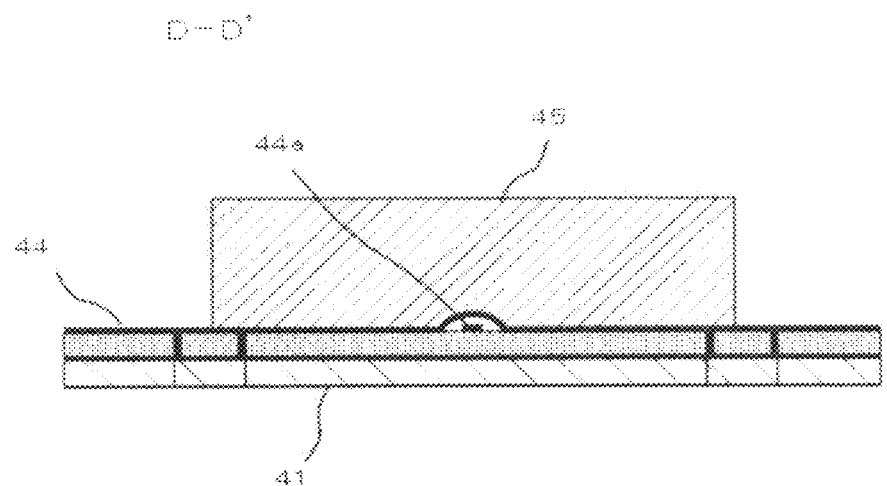
FIG. 10A is a cross-sectional view taken along a plane D-D' indicated in FIG. 7A.
Figure 10B:
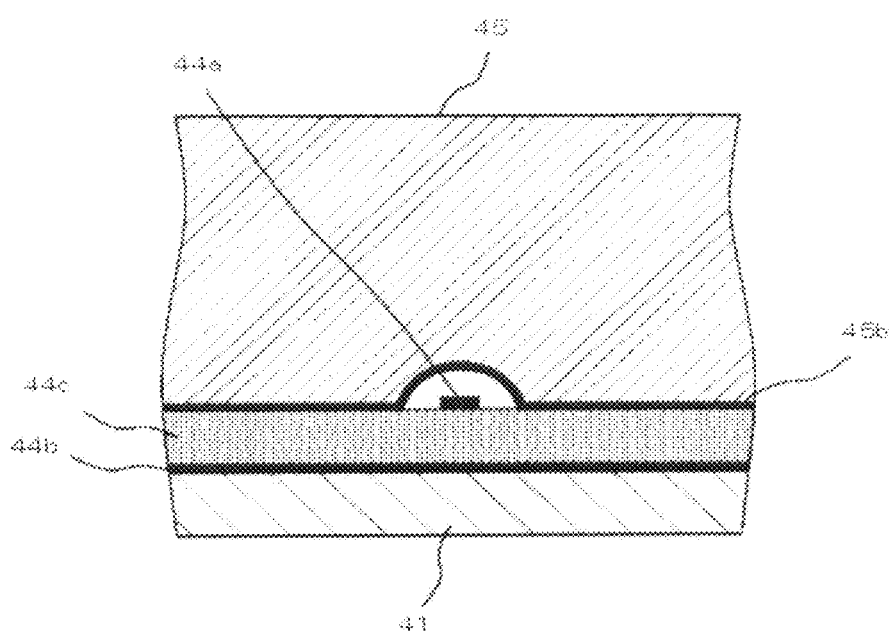
FIG. 10B is an enlarged cross-sectional view illustrating a vicinity of a signal-side conductor on an output side illustrated in FIG. 10A.

FIG. 6 is an exploded perspective view illustrating the semiconductor package according to the fourth embodiment, and FIGS. 7A to D are perspective views illustrating an entire semiconductor package and respective portions thereof. Further, FIGS. 8 and 9 are cross-sectional views taken along a surface C-C' in FIG. 7A, and FIGS. 10A to 10B are cross-sectional views taken along a surface D-D' in FIG. 7A. Note that, in all of the drawings, a semiconductor device 43 is housed inside the semiconductor package.

As illustrated in FIGS. 6 to 10B, a semiconductor package 4 includes a waveguide interface metal plate 41 as a first metal body, a chip-mounting metal plate 42 as a second metal body, the semiconductor device 43, a line substrate 44, and a lid body 45.

The waveguide interface metal plate 41 is a flat metal plate. The waveguide interface metal plate 41 is formed of, for example, copper, aluminum, or alloy containing these metals. On the waveguide interface metal plate 41, a through-hole 41a is formed as illustrated in FIG. 6. The through-hole 41a has a shape corresponding to a cross-sectional shape of the waveguide connected to the semiconductor package 4. An opening at a lower side of the through-hole 41a is a portion to become a connection end between the outside and the semiconductor package 4. For example, a waveguide for a millimeter waveband (not illustrated) is connected to the opening at the lower side of the through-hole 41a for signal input and output. In the case where the waveguide is connected, the through-hole 41a becomes apart of a conduit line of the waveguide.

As illustrated in FIG. 8, a chip-mounting metal plate 42 is disposed on an upper surface of the waveguide interface metal plate 41. The chip-mounting metal plate 42 is a flat metal plate. The chip-mounting metal plate 42 is fixed to the waveguide interface metal plate 41, having a lower surface thereof adhered to the upper surface of the waveguide interface metal plate 41. The chip-mounting metal plate 42 includes a mounting area for mounting the semiconductor device and the like on an upper surface thereof. According to the present embodiment, the semiconductor device 43 is mounted on this mounting area. The chip-mounting metal plate 42 is formed of, for example, a metal having good thermal conductivity, such as copper. Therefore, the chip-mounting metal plate 42 is a good heat radiation path that conducts heat of the semiconductor device 43 to the waveguide interface metal plate 41.

The line substrate 44 is disposed on the upper surface of the waveguide interface metal plate 41. The line substrate 44 is fixed to an adjacent area of the chip-mounting metal plate 42 so as to cover the through-hole 41a. According to the present embodiment, the line substrate 44 is formed of one piece of line substrate. However, the line substrate 44 may be formed of a plurality of line substrates. For example, the line substrate 44 may be divided into the plurality of line substrates such as an input side and an output side. In this case, the line substrates may be disposed to face each other, interposing the mounting area.

On the input side of the line substrate 44, a microstrip line to be a transmission line for a signal received by the semiconductor device 43 (hereinafter referred to as an input-side transmission line) is formed. The input-side transmission line is formed of a signal-side conductor 44e and a ground-side conductor 44b. One end of the signal-side conductor 44e is connected to the semiconductor device 43, and the other end is projected from the lid body 45 so as to pierce a side wall surface of the lid body 45. The projected portion is to be a signal input interface. The signal-side conductor 44e is formed on an upper surface side of the line substrate 44, and the ground-side conductor 44b is formed on a lower surface side of the line substrate 44. The line substrate 44 includes a flat dielectric substrate 44c. The dielectric substrate 44c is disposed between the signal-side conductor 44e and the ground-side conductor 44b. Note that the ground-side conductor 44b may also be formed planar. Further, the ground-side conductor 44b may be fixed to the chip-mounting metal plate 42 such that an entire surface thereof contacts the chip-mounting metal plate 42.

On the other hand, the microstrip line to be a transmission line for a signal output from the semiconductor device 43 (hereinafter referred to as an output-side transmission line) is formed on the output side of the line substrate 44. The output-side transmission line is formed of a signal-side conductor 44a and a ground-side conductor 44b. The line substrate 44 is fixed to an upper surface of the chip-mounting metal plate 42 so as to cover an open surface of the through-hole 41a. The line substrate 44 includes a projected portion 44f projected to the open surface of the through-hole 41a. One end of the signal-side conductor 44a is connected to the semiconductor device 43. The other end is an extending portion 44d as illustrated in FIG. 9. The extending portion 44d is formed on the projected portion 44f, and overlaps the open surface of the through-hole 41a. The extending portion 44d has a length L which is a quarter of a signal wavelength in the signal transmission line. A structure in the vicinity of the extending portion 44d will be described later.

The lid body 45 is a back-short incorporated lid body configured to integrally cover the through-hole 41a, chip-mounting metal plate 42, and line substrate from above. The lid body 45 is disposed on the waveguide interface metal plate 41. One end of the input-side transmission line is exposed from between the lid body 45 and the waveguide interface metal plate 41. On a lower surface side of the lid body 45, a recessed portion to be a back-short end (space 45a illustrated in FIG. 8) is formed. The space 45a is a space partitioned by an outer wall of the lid body 45 and an inner partition wall 45e of the lid body 45. The space 45a is located at a position corresponding to the open surfaces of the through-hole 41a. The space 45a has a shape formed by extending the shape of the open surface of the through-hole 41a upward as it is. A height from the signal-side conductor 44a to an upper wall surface 45d (indicated by H in FIG. 9) is a quarter of a signal wavelength in the waveguide. An entire inner wall surface 45b of the space 45a is metal-coated. By this metal coating, the space 45a functions as the back-short end of the waveguide.

A space 45c is formed on the lower surface side of the lid body 45, in addition to the space 45a. The space 45c is a space for housing the semiconductor device 43 and the signal transmission line and the like on the line substrate 44. An inner wall surface 45f of the space 45c is metal-coated, except for a portion close to the signal line. The metal coat is grounded via the line substrate 44. Therefore, the inner wall surface 45f has a shielding effect.

The lid body 45 is formed of light resin material such as plastic. Accordingly, the lid body 45 is, of course, lightweight and an entire semiconductor package 4 is lightweight.

The through-hole 41a, space 45a, and a part of the line substrate 44 (the portion interposed between the through-hole 41a and space 45a) are to be a signal converting section. A signal transmitted at the line substrate 44 is converted to a signal transmitted at the waveguide in the converting section.

FIG. 9 is an enlarged view illustrating the converting section illustrated in FIG. 8. In the example of FIG. 9, the waveguide (not illustrated) is connected from a lower side of the opening of the through-hole 41a. The projected portion 44f of line substrate 44 is positioned above the through-hole 41a. The extending portion 44d is formed on the projected portion 44f. The extending portion 44d is an end portion of the signal-side conductor 44e. More specifically, the extending portion is extended so as to overlap the open surface of the through-hole 41a. The extending portion 44d has a length L which is a quarter of the signal wavelength in the signal transmission line. The space 45a is formed above the extending portion 44d. A height H from the extending portion 44d to the upper wall surface 45d of the space 45a is a quarter of the signal wavelength in the waveguide.

The inner wall surface 45b of the space 45a is entirely metal-coated. For the metal coating material, gold, silver, or the like is used, for example. The inner wall surface of the space 45a becomes a flat surface having little roughness on the surface by applying such metal coating to the inner wall surface 45b. This configuration reduces loss of signal at the converting section. The above-described structure of the converting section is sometimes called the back-short structure. Also, the upper wall surface 45d is sometimes called a short-circuit surface, or a back-short.

Figure 11:
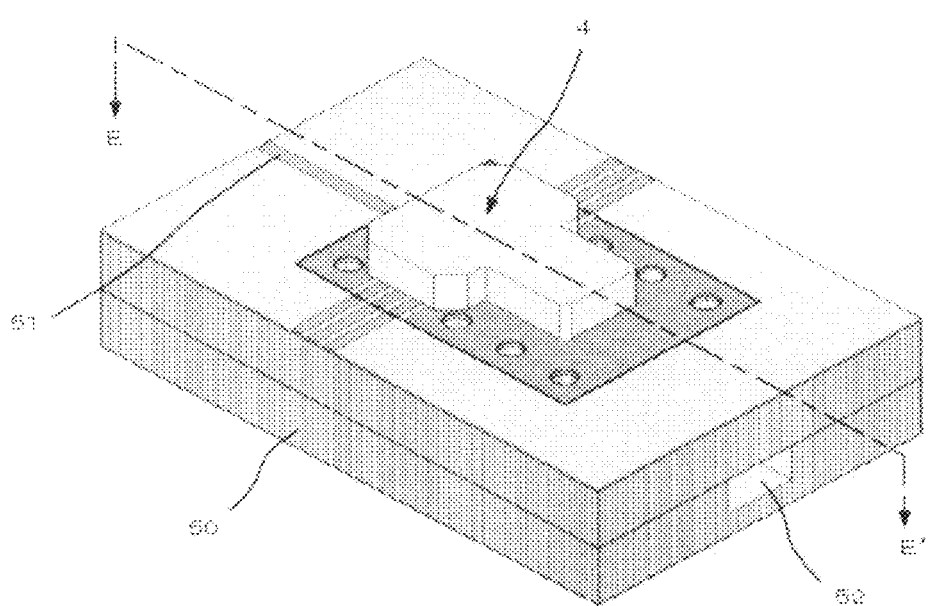
FIG. 11 is an external perspective view illustrating the semiconductor package mounted on a base.

Next, an example of implementing the semiconductor package 4 having the above-described configuration will be described. FIG. 11 is an external perspective view illustrating the semiconductor package 4 mounted on a base 50 when a man skilled in the art configures a signal power amplifier or the like by using the semiconductor package 4. FIG. 12 is a cross-sectional view taken along a surface E-E' in FIG. 11. In this example, a semiconductor device for amplifying power of a signal having a large amount of heat generation is housed inside the semiconductor package 4, for example.

The base 50 is formed of, for example, copper, aluminum, or alloy containing these metals. In many cases, the signal power amplifier has a low signal level on an input side. Additionally, a former stage of the semiconductor package 4 is often connected to a high-frequency functional circuit, and a microstrip line is used for this mutual connection in most cases. Therefore, a microstrip line 51 is formed on the base 50 as transmission line for an input signal to the semiconductor package 4. On the other hand, in the case where the semiconductor device housed in the semiconductor package 4 is the semiconductor device for signal power amplification, the signal level output from the semiconductor package 4 is high. Therefore, a waveguide path 52 is formed on the base 50 as a transmission line of an output signal.

A signal input interface of the semiconductor package 4 is not a waveguide interface but the microstrip line. Therefore, an end portion 44g of an input-side line substrate can be connected to the microstrip line 51 of the base 50 side by using, for example, a lead terminal 46. Further, the semiconductor package 4 includes a through-hole 41a as a waveguide interface on the signal output side. Accordingly, the man skilled in the art can directly connect the waveguide path 52 to the semiconductor package 4. Thus, the semiconductor package 4 includes the interface applicable for an input signal and an output signal respectively. Therefore, unnecessary transmission loss caused by conversion executed at the transmission line can be reduced because the semiconductor package 4 can be directly connected to the base 50.

In many cases, the semiconductor package 4 according to the present embodiment is mounted with a semiconductor device having a large amount of heat generation such as a semiconductor device for signal power amplification because the semiconductor package 4 includes the back-short structure. According to the present embodiment, the semiconductor device is mounted on the chip-mounting metal plate 12. The chip-mounting metal plate 12 is a good heat radiation path to the waveguide interface metal plate 11 because the chip-mounting metal plate is formed of the metal having good thermal conductivity. Further, according to the fourth embodiment, the waveguide interface metal plate 11 contacts the base 50. Accordingly, heat transmitted to the waveguide interface metal plate 11 is immediately transmitted to the base 50. Therefore, even in the case where the semiconductor device has a large amount of heat generation, the semiconductor device can have sufficient heat radiation characteristics.

Further, the lid body 45 entirely covers the through-hole 41a, chip-mounting metal plate 42, semiconductor device 43, and line substrate 44 from above, and also includes the space 45a formed on the lower surface side thereof. In the case of manufacturing the lid body 45 having the above-described shape, using the metallic material by the mold, the lid body 45 becomes heavyweight. Further, loss of the signal at the converting section between the waveguide and the line substrate 44 becomes large because it is difficult to reduce roughness on the inner wall surface 45b. Since the resin such as plastic is used for the material of the lid body 45 according to the present embodiment, the lid body 45 is lightweight and easily manufactured by the mold. Moreover, since the inner wall surface 45b of the space 45a is metal-coated, the inner wall surface 45b is a smooth flat surface having little roughness on the surface. As a result, loss of the signal at the converting section is small.

As described above, according to the present embodiment, it is possible to obtain the semiconductor package having sufficient heat radiation characteristics and including the waveguide interface having small signal transmission loss, small-sized, lightweight, and easily manufactured.

While certain embodiments have been described, these embodiments have been presented by way of example only, and are not intended to limit the scope of the inventions. Indeed, the novel apparatus and methods described herein may be embodied in a variety of other forms; furthermore, various omissions, substitutions and changes in the form of the apparatus and methods described herein may be made without departing from the spirit of the inventions. The accompanying claims and there equivalents are intended to cover such forms of modifications as would fall within the scope and spirit of the invention.

What is claimed is:

1. A semiconductor package comprising:
a first metal body in which a waveguide structure is formed;
a second metal body including a mounting area for a semiconductor device and disposed on the first metal body;
a line substrate on which a signal transmission line configured to communicate a waveguide with the semiconductor device mounted on the mounting area; and
a lid body made of resin, wherein a structure corresponding to another waveguide structure on an extension of the waveguide structure in the first metal body is formed, an inner wall surface of the structure is metal-coated, and the lid body is disposed at a position facing the first metal body, interposing the second metal body and the line substrate, wherein
the waveguide in the lid body is a through-hole,
the waveguide in the first metal body is a recessed portion on an extension of the waveguide structure in the lid body to be a back-short end of the waveguide in the lid body, and
an inner wall surface of the through-hole is metal-coated.

2. The semiconductor package according to claim 1, wherein
two of the through-holes are formed on the lid body, and a recessed portion to be a back-short end of the waveguide is formed on the first metal body at a position corresponding to the through-hole of the lid body.

3. The semiconductor package according to claim 2, wherein
the lid body includes a first flat surface and a second flat surface orthogonal to the first flat surface,
the through-hole is a waveguide path formed inside the lid body, having one opening facing the recessed portion and the other opening connected to the waveguide, and
two of the through-holes having two of the openings on a side of the recessed portion positioned at the first flat surface and having at least one of the openings on the other side positioned at the second flat surface.

4. The semiconductor package according to claim 3, wherein gold or silver is used for a material of the metal coating.

5. The semiconductor package according to claim 1, wherein the line substrate includes:
a first signal transmission line configured to communicate the waveguide with a semiconductor device mounted on the mounting area and release a signal output from the semiconductor device mounted on the mounting area to the waveguide, and
a second signal transmission line connected to an external signal transmission line and configured to input the signal received from outside to the semiconductor device.

6. The semiconductor package according to claim 5, wherein gold or silver is used for a material of the metal coating.

* * * * *